United States Patent
Chen et al.

(10) Patent No.: US 7,244,975 B2
(45) Date of Patent: Jul. 17, 2007

(54) HIGH-VOLTAGE DEVICE STRUCTURE

(75) Inventors: Anchor Chen, Hsin-Chu (TW);
 Chih-Hung Lin, Hsin-Chu (TW);
 Hwi-Huang Chen, Hsin-Chu (TW);
 Jih-Wei Liou, Hsin-Chu (TW);
 Chin-Hung Liu, Taipei Hsien (TW);
 Ming-Tsung Tung, Hsin-Chu (TW);
 Chien-Ming Lin, Hsin-Chu (TW);
 Jung-Ching Chen, Tai-Chung Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 11/160,657

(22) Filed: Jul. 5, 2005

(65) Prior Publication Data

US 2007/0018258 A1 Jan. 25, 2007

(51) Int. Cl.
 *H01L 27/10* (2006.01)
 *H01L 29/739* (2006.01)
 *H01L 29/73* (2006.01)
 *H01L 29/76* (2006.01)
 *H01L 29/94* (2006.01)

(52) U.S. Cl. ............... 257/203; 257/202; 257/204; 257/206; 257/339; 257/341; 257/376; 257/401; 257/409; 257/487

(58) Field of Classification Search ........... 257/339, 257/341, 376, 401, 409, 487, 202–204, 206
 See application file for complete search history.

(56) References Cited

U.S. PATENT DOCUMENTS

| 4,783,692 | A | * | 11/1988 | Uratani | 257/206 |
|---|---|---|---|---|---|
| 5,789,791 | A | * | 8/1998 | Bergemont | 257/401 |
| 5,847,421 | A | * | 12/1998 | Yamaguchi | 257/207 |
| 6,566,720 | B2 | * | 5/2003 | Aldrich | 257/369 |
| 2002/0175392 | A1 | * | 11/2002 | Jeon et al. | 257/500 |
| 2003/0134481 | A1 | * | 7/2003 | Fallica | 438/311 |
| 2003/0178650 | A1 | * | 9/2003 | Sonoda et al. | 257/204 |
| 2003/0222285 | A1 | * | 12/2003 | Negishi et al. | 257/203 |
| 2004/0145027 | A1 | * | 7/2004 | Nitta et al. | 257/492 |
| 2005/0056898 | A1 | * | 3/2005 | Kaneko et al. | 257/373 |
| 2005/0199968 | A1 | * | 9/2005 | Matsui et al. | 257/412 |
| 2006/0017114 | A1 | * | 1/2006 | Chen et al. | 257/371 |

* cited by examiner

*Primary Examiner*—Ida M. Soward
(74) *Attorney, Agent, or Firm*—Winston Hsu

(57) ABSTRACT

A high-voltage device structure includes a high-voltage device disposed on a semiconductor substrate. The semiconductor includes an active region and an isolation region, and the high-voltage device is disposed in the active region. The high-voltage device structure includes a source diffusion region of a first conductive type, a drain region of the first conductive type, and a gate longer than the source diffusion region and the drain diffusion region so as to form spare regions on both sides of the gate. The isolation region is outside the active region and surrounds the active region. In the isolation region, an isolation ion implantation region of a second conductive type and an extended ion implantation region are disposed to prevent parasitic current from being generating between the source diffusion region and the drain diffusion region.

10 Claims, 3 Drawing Sheets

HIGH-VOLTAGE DEVICE STRUCTURE

BACKGROUND OF THE INVENTION

1. Field of the Invention

The present invention is related to a high-voltage device structure, particularly to a high-voltage metal oxide semiconductor (HVMOS) device structure that can prevent current leakage.

2. Description of the Prior Art

HVMOS devices are MOS devices for use under high voltage. Presently, HVMOS devices have been applied in central processing unit (CPU) power supplies, power management systems, and AC/DC converters.

Please refer to FIG. 1. FIG. 1 is a plan view schematically illustrating a conventional high-voltage N-type metal oxide semiconductor (HV NMOS) structure 10. As shown in FIG. 1, an HV NMOS device 50 is formed in a P-type substrate (not shown). The HV NMOS device 50 includes a first N-doped region 12 (indicated by a cross-hatched region), a second N-doped region 14 (indicated by a cross-hatched region), a channel diffusion region 16 (indicated by a dash-dot line) connecting portions of the first N-doped region 12 and the second N-doped region 14, and a poly-silicon gate 18 covering the channel diffusion region 16.

The HV NMOS structure 10 further includes a source diffusion region 20 located in the first N-doped region 12, a drain diffusion region 22 located in the second N-doped region 14, and an isolation structure 24 located in the P-type substrate to properly isolate the source diffusion region 20, the drain diffusion region 22, and the channel diffusion region 16. The source diffusion region 20, the drain diffusion region 22, and the poly-silicon gate 18 are electrically connected with external circuits (not shown) through contact plugs 26, 28, 30, 32, and 34.

In addition, a guard ring 40 is disposed around the HVMOS device 50 to electrically isolate MOS devices. The guard ring 40 serves as a channel stop by being doped with dopants of charge opposite the source diffusion region 20 and the drain diffusion region 22. For example, in the HV NMOS device 50, the guard ring 40 is a P-doped region that is doped with boron. However, when operated at high-voltage, if the guard ring 40 contacts the source diffusion region 20 or the drain diffusion region 22 of the HV NMOS device 50, breakdown of the device may occur. In other words, if a positive voltage is provided to the drain diffusion region 22 of the HV NMOS 50, a reverse bias will be formed around the boundary of the drain diffusion region 22 and the guard ring 40, which is a PN junction. When the bias is higher than the breakdown voltage of the PN junction, the device may be damaged. Since high operation voltage is applied to the HV MOS device 50, if the breakdown voltage is not high enough, damage of the device may occur.

In order to solve the above problem, in the prior art, a space is provided between the source and drain diffusion regions 20, 22 and the guard ring, to increase the breakdown voltage and prevent the high-voltage device from breaking down. In other words, in the prior art HVMOS device 50, the channel diffusion region 16 is longer than the source diffusion region 20 and the drain diffusion region 22. In addition, spaces where the channel diffusion region 16 is longer than both the source diffusion region 20 and the drain diffusion region 22 form two spare regions 36 and 38. However, due to the ever decreasing element size in semiconductor technology, the source diffusion region 20 and the drain diffusion region 22 are so close that parasitic current may be generated in the spare regions 36 and 38, which have high gate voltages. In addition, boron segregating to an isolation strusture interface and a low boron concentration effect may cause a kink effect or other unpredictable I-V characteristic curves, or result in a snapback effect that damages the device.

Therefore, an improved HVMOS structure is needed to solve the problem of current leakage and prevent the high-voltage device from being damaged.

SUMMARY OF THE INVENTION

The main object of the present invention is to provide a high-voltage device structure that can prevent the generation of leakage current, so as to solve the problems of conventional high-voltage devices.

According to the claims of the present invention, a high-voltage device structure is disclosed. The high-voltage device is disposed on a substrate, which has an active region and an isolation region, and the high-voltage device is disposed in the active region. A first ion implantation region and a second ion implantation region are disposed in the active region, and both the first ion implantation region and the second implantation region are of a first conductive type. A source diffusion region and a drain diffusion region are disposed on the ion implantation regions respectively. A channel diffusion region connecting the ion implantation regions is disposed between the ion implantation regions. In addition, a gate is disposed on the surface of the active region of the substrate. The gate is above the channel diffusion region. The gate is longer than the source diffusion region and the drain diffusion region. Two spare regions are thus formed on both sides of the gate. In the isolation region, an isolation ion implantation region of a second conductive type and an extended ion implantation region of the second conductive type, which is under the spare regions, are disposed. The ion implantation regions in the isolation region are to prevent parasitic current from being generated between the source diffusion region and the drain diffusion region.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
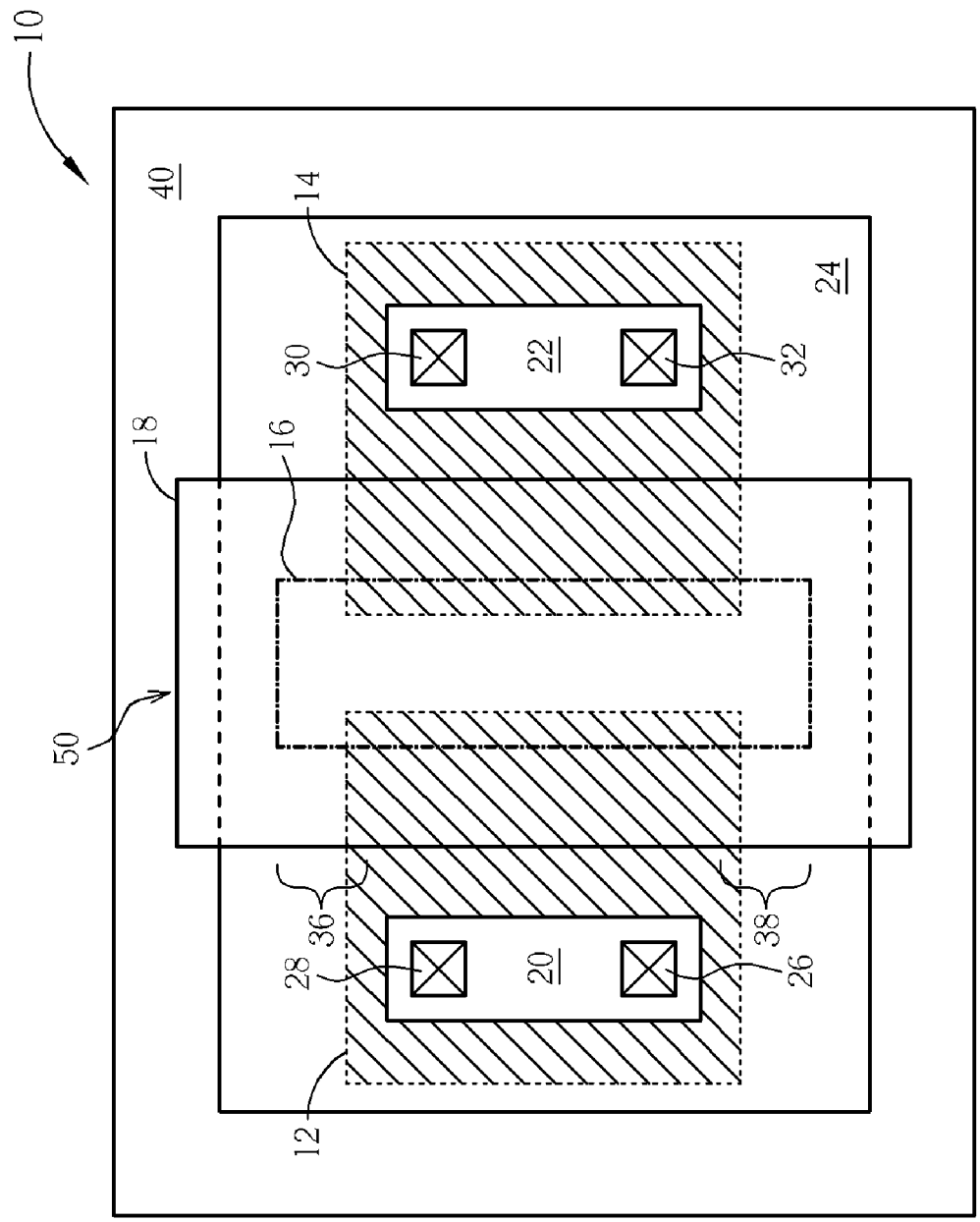
FIG. 1 is a plan view of a conventional HV NMOS structure.
Figure 2:
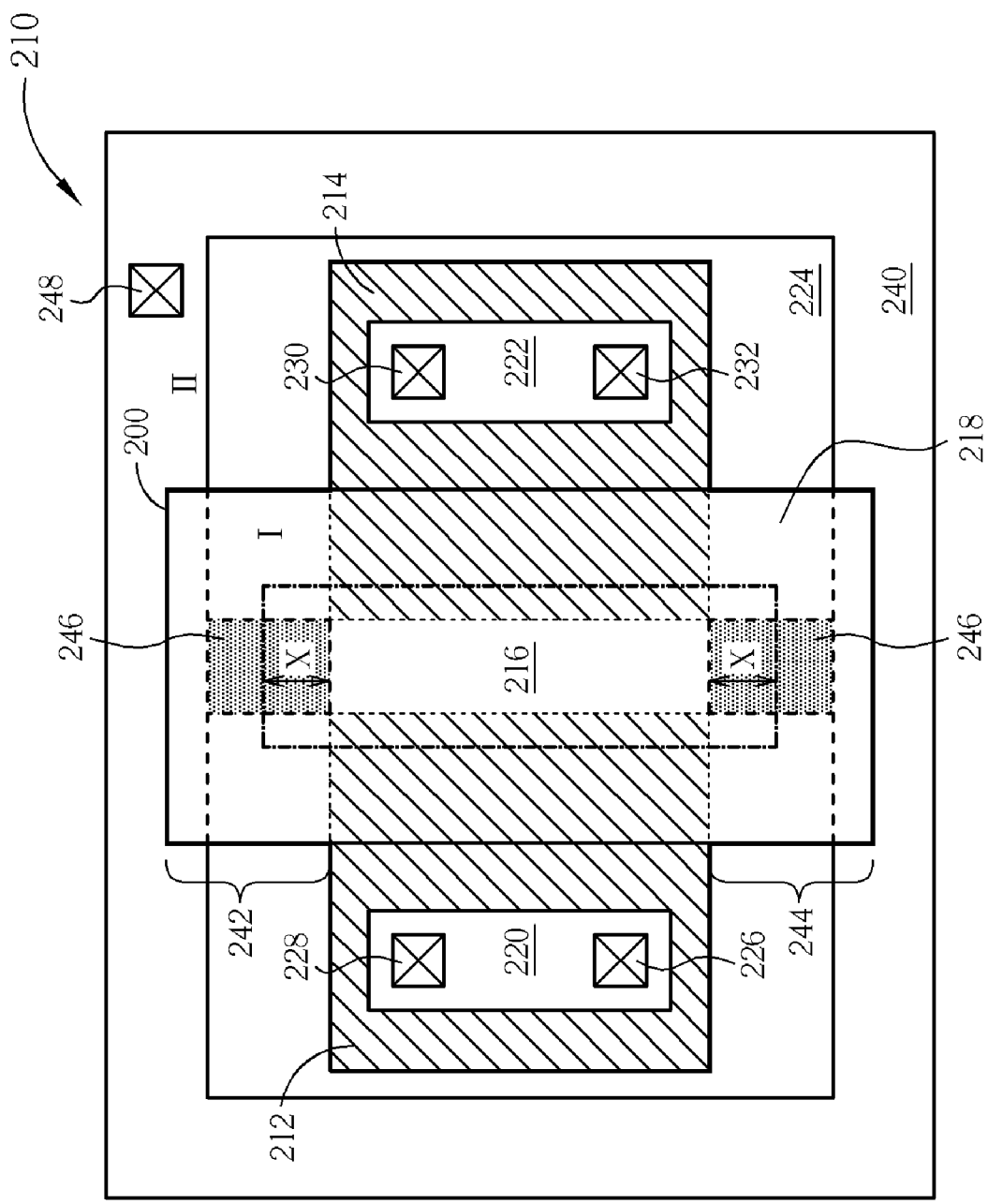
FIG. 2 is a plan view of a high-voltage device structure according to an embodiment of the present invention.

Please refer to FIG. 2. FIG. 2 is a plan view of a high-voltage device structure 210 according to the present invention. According to FIG. 2, a high-voltage device 200 according to the present invention is disposed on a semiconductor substrate (not shown) that has an active region I and an isolation region II. The high-voltage device 200 is disposed in the active region I. The isolation region II is disposed outside the active region and surrounds the active region I. In addition, in the present embodiment, the high-voltage device 200 is a high-voltage metal oxide semiconductor device.

In the active region I, the high-voltage device structure 210 includes a first ion implantation region 212 (indicated by a cross-hatched region) of a first conductive type, a second ion implantation region 214 (indicated by a cross-hatched region) of the first conductive type, and a channel diffusion region 216 (indicated by a dash-dot line) connecting parts of the first ion implantation region 212 and the second ion implantation region 214. The high-voltage device structure 210 further includes a source diffusion region 220 disposed in the first ion implantation region 212, and a drain diffusion region 222 disposed in the second ion implantation region 214. The source diffusion region 220 and the drain diffusion region 222 can be connected to external circuits (not shown) with contact pads 226, 228, 230 and 232 respectively.

The high-voltage device structure 210 further includes a gate 218 covering the channel diffusion region 216. The gate 218 consists of poly-silicon, a double-layer structure of poly-silicon, a compound of metal and poly-silicon, or similar. There can be an oxide layer (not shown) disposed between the gate 218 and the substrate (not shown). In addition, since the gate 218 is longer than the source diffusion region 220 and the drain diffusion region 222, two spare regions 242, 244 are formed on both sides of the gate.

In the isolation region II, an isolation strucure 224 is disposed to provide well isolation between the source diffusion region 220, the drain diffusion region 222, and the channel diffusion region 216. There is a guard ring 240 outside the isolation structure 224 to provide electrical isolation between high-voltage devices. The guard ring 240, is an ion implantation region, also termed an isolation ion implantation region, of a second conductive type so as to serve as a channel stop. Since the isolation structure 224 lies between the guard ring 240 and the source and drain diffusion regions 220 and 222, electrical breakdown is prevented.

However, to prevent current leakage from the drain diffusion region 222 to the source diffusion region 220 through the region under the spare regions 242, 244, an extended ion implantation region 246 is provided according to the present invention. The extended ion implantation region 246 is extended from the guard ring 240. The extended ion implantation region 246 is formed by doping the regions partially under of the spare regions 242, 244, and is an ion implantation region of the second conductive type. In addition, the extended ion implantation region 246 and the guard ring 240 can be doped at the same time to reduce process demands. The extended ion implantation region 246 is capable of preventing the generation of leakage current through the spare regions 242, 244, and thus improves the efficiency of the HV MOS structure 210. In addition, the guard ring 240 can also include a contact plug 248 to connect to outside circuits (not shown).

In addition, the extended ion implantation region 246 can partially cover the channel diffusion region 216 (0<X), can just contact the channel diffusion region (X=0), or can be at a distance from the channel diffusion region (X<0).

It should be noted that the present invention can be applied both in HV NOS devices and HV PMOS devices. The present invention can decrease the leakage current in an HV NMOS device and an HV PMOS device, and can reduce the kink effect and snapback in an HV NMOS due to boron diffusion to the isolation structure interface and the low boron concentration effect. Therefore, when the first conductive type is N type and the second conductive type is P type, the high-voltage device 200 in the active region I is an N-type high-voltage device, and the guard ring 240 and the extended ion implantation region 246 in the isolation region are P-type ion implantation regions. On the contrary, when the first conductive type is P type and the second conductivity type is N type, the high-voltage device 200 in the active region I is a P-type high-voltage device, and the guard ring 240 and the extended ion implantation region 246 in the isolation region are N-type ion implantation regions. In addition, the substrate may be of the first conductive type or the second conductive type, and a doped well may be disposed between the high-voltage device structure 210 and the substrate.

Figure 3:
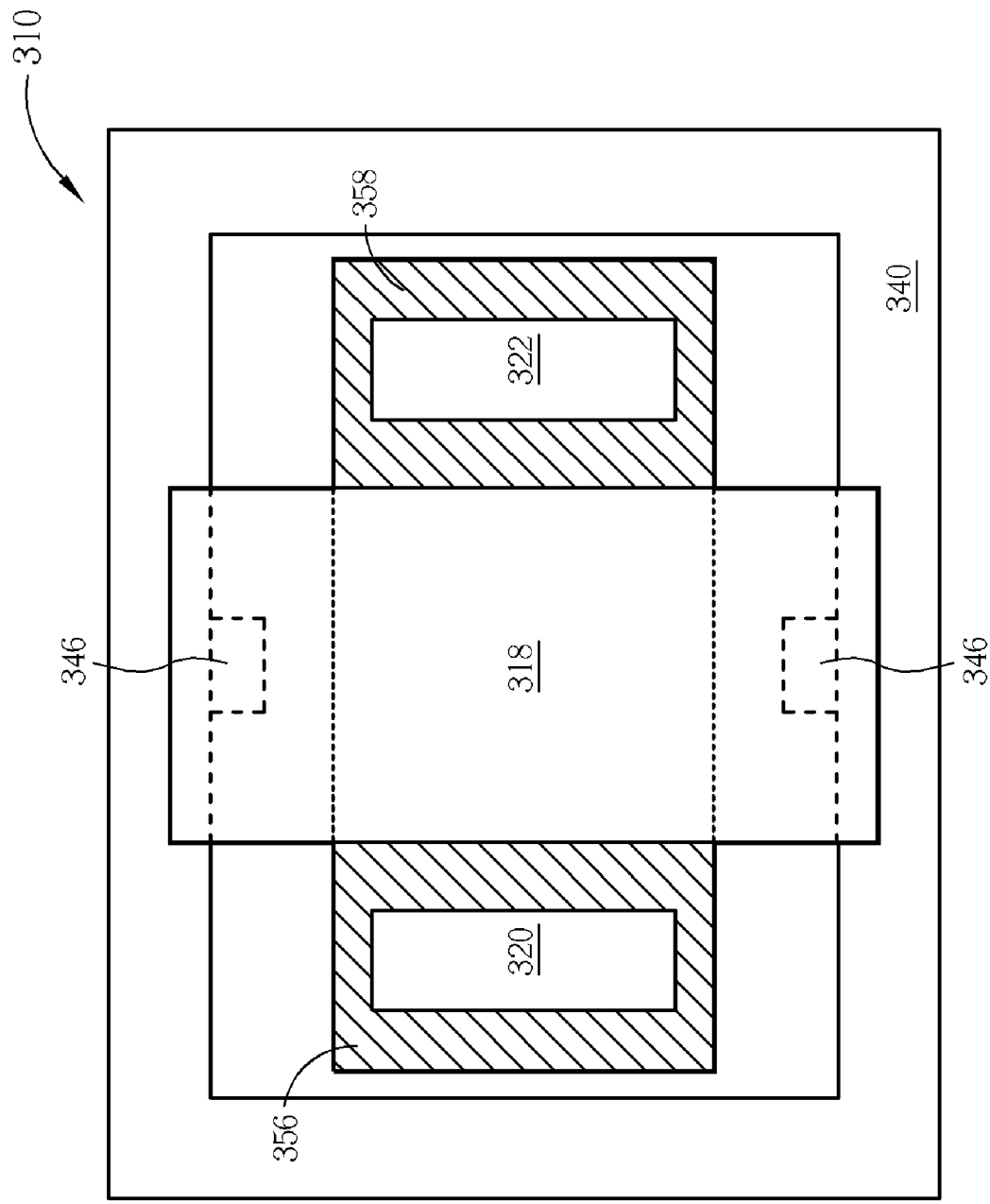
FIG. 3 is s a plan view of a DDD high-voltage device structure according to an embodiment of the present invention.

In addition to HV MOS structure 210 FIG. 2, the present invention may have other HV MOS structure. For example, the present invention may have double diffused drain (DDD) structure as shown in FIG. 3. The HV MOS 310 has a first ion implantation region of a first conductive type 320, a second ion implantation region of a first conductive type 322, a third ion implantation region of a first conductive type 356, and a fourth ion implantation region of a first conductive type 358. The four ion implantation regions 320, 322, 356, 358 forming DDD structures in both side of the gate 318 respectively. Ion implantation regions 320, 356 may serve as source and ion implantation regions 322, 358 may serve as drain. Similarly, in addition to the guard ring 340, two extended ion implantation regions of a second conductive type 346 are formed to serve as channel stops between source and drain.

Compared to the conventional high-voltage device structure, the present invention provides an extended ion implantation region to form a channel stop between the source and the drain, so as to decrease the leakage current between the source and the drain. Therefore, the kink effect and snapback caused by the leakage current in the prior art are improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high-voltage device structure, the high-voltage device structure being disposed in an active region of a semiconductor substrate divided into the active region and an isolation region, the high-voltage device structure comprising:

a first ion implantation region of a first conductive type and a second ion implantation region of a first conductive type disposed in the active region;

a source diffusion region and a drain diffusion region disposed in the first ion implantation region and the second ion implantation region respectively;

a channel diffusion region disposed between the first ion implantation region and the second ion implantation region and connecting the two ion implantation regions;

a gate disposed between the source diffusion region and the drain diffusion region and above the channel diffusion region, the gate being longer than the source diffusion region and the drain diffusion region forming two spare regions on both sides of the gate;

an isolation ion implantation region of a second conductive type disposed in the isolation region; and an extended ion implantation region of the second conductive type disposed under the spare region of the gate and covering portions of the channel diffusion region.

2. The structure of claim 1, wherein the extended ion implantation region is not contact with the channel diffusion region.

3. The structure of claim 1, wherein the extended ion implantation region is contact with the channel diffusion region.

4. The structure of claim 1, wherein the isolation region is outside the active region and surrounds the active region.

5. The structure of claim 1, wherein the high-voltage device structure is a high-voltage metal oxide semiconductor.

6. The structure of claim 1, wherein the first conductive type is N type and the second conductive type is P type.

7. The structure of claim 1, wherein the first conductive type is P type and the second conductive type is N type.

8. The structure of claim 1, further comprising a contact plug on the source diffusion region and a contact plug on the drain diffusion region.

9. The structure of claim 1, further comprising a contact plug on the isolation ion implantation region.

10. The structure of claim 1, wherein the isolation ion implantation region is a guard ring.

* * * * *